(12) United States Patent
Edge et al.

(10) Patent No.: US 10,930,566 B2
(45) Date of Patent: *Feb. 23, 2021

(54) COMPLEMENTARY METAL OXIDE SEMICONDUCTOR REPLACEMENT GATE HIGH-K METAL GATE DEVICES WITH WORK FUNCTION ADJUSTMENTS

(71) Applicant: INTERNATIONAL BUSINESS MACHINES CORPORATION, Armonk, NY (US)

(72) Inventors: Lisa F. Edge, Watervliet, NY (US); Hemanth Jagannathan, Niskayuna, NY (US); Paul C. Jamison, Averill Park, NY (US); Vamsi K. Paruchuri, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,970

(22) Filed: Jan. 2, 2020

(65) Prior Publication Data

US 2020/0144134 A1 May 7, 2020

Related U.S. Application Data

(63) Continuation of application No. 16/273,779, filed on Feb. 12, 2019, now Pat. No. 10,573,565, which is a
(Continued)

(51) Int. Cl.
*H01L 21/8238* (2006.01)
*H01L 27/092* (2006.01)
(Continued)

(52) U.S. Cl.
CPC ........... *H01L 21/823842* (2013.01); *H01L 21/823821* (2013.01); *H01L 21/823878* (2013.01);
(Continued)

(58) Field of Classification Search
CPC combination set(s) only.
See application file for complete search history.

(56) References Cited

U.S. PATENT DOCUMENTS 6,696,333 B1  2/2004  Zheng et al.
7,541,650 B2  6/2009  Hung et al.
(Continued)

OTHER PUBLICATIONS

Choi, K. et al., "Effective work function modification of atomic-layer-deposited-TaN film by capping layer" Appl. Phys. Lett. (2006) 3 pages, vol. 89, 032113.
(Continued)

*Primary Examiner* — Ratisha Mehta
(74) *Attorney, Agent, or Firm* — Tutunjian & Bitetto, P.C.; Daniel Morris (57) ABSTRACT

An electrical device that includes a p-type semiconductor device having a p-type work function gate structure including a first high-k gate dielectric, a first metal containing buffer layer, a first titanium nitride layer having a first thickness present on the metal containing buffer layer, and a first gate conductor contact. A mid gap semiconductor device having a mid gap gate structure including a second high-k gate dielectric, a second metal containing buffer layer, a second titanium nitride layer having a second thickness that is less than the first thickness present, and a second gate conductor contact. An n-type semiconductor device having an n-type work function gate structure including a third high-k gate dielectric present on a channel region of the n-type semiconductor device, a third metal containing
(Continued)

buffer layer on the third high-k gate dielectric and a third gate conductor fill present atop the third metal containing buffer layer.

20 Claims, 7 Drawing Sheets

Related U.S. Application Data continuation of application No. 15/290,410, filed on Oct. 11, 2016, now Pat. No. 10,304,746, which is a continuation of application No. 14/955,443, filed on Dec. 1, 2015, now Pat. No. 9,490,255.

(51) Int. Cl.

| | | |
|---|---|---|
| H01L 27/12 | (2006.01) | |
| H01L 29/51 | (2006.01) | |
| H01L 29/78 | (2006.01) | |
| H01L 21/84 | (2006.01) | |
| H01L 29/49 | (2006.01) | |
| H01L 29/66 | (2006.01) | |
| H01L 29/786 | (2006.01) | |

(52) U.S. Cl.
CPC ........ *H01L 21/845* (2013.01); *H01L 27/0924* (2013.01); *H01L 27/1211* (2013.01); *H01L 29/4966* (2013.01); *H01L 29/51* (2013.01); *H01L 29/517* (2013.01); *H01L 29/66545* (2013.01); *H01L 29/785* (2013.01); *H01L 29/786* (2013.01)

(56) References Cited

U.S. PATENT DOCUMENTS

| | | | |
|---|---|---|---|
| 8,003,503 B1 | 8/2011 | Clark | |
| 9,012,319 B1* | 4/2015 | Choi | ................ H01L 21/28158 |
| | | | 438/591 |
| 2011/0121401 A1 | 5/2011 | Park et al. | |
| 2011/0272767 A1 | 11/2011 | Yin et al. | |
| 2011/0309447 A1 | 12/2011 | Arghavani et al. | |
| 2012/0088367 A1 | 4/2012 | Sekar et al. | |
| 2012/0228773 A1 | 9/2012 | Brown et al. | |
| 2013/0092992 A1 | 4/2013 | Chang et al. | |
| 2013/0299922 A1* | 11/2013 | Choi | ................ H01L 21/82345 |
| | | | 257/412 |

OTHER PUBLICATIONS

Heo, S.C. et al., "Plasma atomic layer deposited TiN metal gate for three dimensional device applications: Deposition temperature, capping metal and post annealing" Microelectronic Engineering (2012) pp. 11-13, vol. 94.

List of IBM Patents or Patent Applications Treated as Related dated Jan. 2, 2020, 2 pages.

* cited by examiner

COMPLEMENTARY METAL OXIDE SEMICONDUCTOR REPLACEMENT GATE HIGH-K METAL GATE DEVICES WITH WORK FUNCTION ADJUSTMENTS

FIELD OF THE INVENTION

The present disclosure relates generally to semiconductor devices, and more particularly to work function modifications in semiconductor devices.

BACKGROUND

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and circuitry.

Continuing trends in semiconductor device manufacturing include a reduction in electrical device feature size (scaling), as well as improvements in device performance in terms of device switching speed and power consumption. Some examples of methods to improve device switching include adjusting the work function of the materials in the gate structure.

SUMMARY

In one aspect of the present disclosure, an electrical device is provided that includes a semiconductor substrate having an n-type region, a p-type region and a mid gap region. A p-type semiconductor device is present in the p-type region having a p-type work function gate structure comprised of a first high-k gate dielectric, a first metal containing buffer layer present on the first high-k gate dielectric, a first titanium nitride layer having a first thickness present on the metal containing buffer layer, and a first gate conductor contact present on the first titanium nitride layer. A mid gap semiconductor device is present in the mid gap region of the semiconductor substrate having a mid gap gate structure comprised of a second high-k gate dielectric, a second metal containing buffer layer present on the second high-k gate dielectric, a second titanium nitride layer having a second thickness that is less than the first thickness present on the second metal containing buffer layer, and a second gate conductor contact present on the second titanium nitride layer. An n-type semiconductor device is present in the n-type region having an n-type work function gate structure comprised of a third high-k gate dielectric present on a channel region of the n-type semiconductor device, a third metal containing buffer layer on the third high-k gate dielectric and a third gate conductor fill present atop the third metal containing buffer layer.

In one embodiment of the present disclosure, an electrical device is provided that includes a semiconductor substrate having an n-type region, a p-type region and a mid gap region. A p-type semiconductor device is present in the p-type region having a p-type work function gate structure comprised of a first high-k gate dielectric, a first metal containing buffer layer present on the first high-k gate dielectric, a first titanium nitride layer having a first thickness present on the metal containing buffer layer, and a first gate conductor contact present on the first titanium nitride layer. A mid gap semiconductor device is present in the mid gap region of the semiconductor substrate having a mid gap gate structure comprised of a second high-k gate dielectric, a second metal containing buffer layer present on the second high-k gate dielectric, a second titanium nitride layer having a second thickness that is less than the first thickness present on the second metal containing buffer layer, and a second gate conductor contact present on the second titanium nitride layer. An n-type semiconductor device is present in the n-type region having an n-type work function gate structure comprised of a third high-k gate dielectric present on a channel region of the n-type semiconductor device, a third metal containing buffer layer on the third high-k gate dielectric, a third titanium nitride layer present on the third metal containing buffer layer having a third thickness less than the second thickness, and a third gate conductor fill present atop the third titanium nitride layer.

In another aspect, a method of forming a semiconductor device is provided that includes providing semiconductor substrate having an n-type region, a p-type region and a mid gap region. Forming a p-type semiconductor device in the p-type region having a p-type work function gate structure comprised of a first high-k gate dielectric, a first metal containing buffer layer present on the first high-k gate dielectric, a first titanium nitride layer having a first thickness present on the metal containing buffer layer, and a first gate conductor contact present on the first titanium nitride layer. Forming a mid gap semiconductor device in the mid gap region of the semiconductor substrate having a mid gap gate structure comprised of a second high-k gate dielectric, a second metal containing buffer layer present on the second high-k gate dielectric, a second titanium nitride layer having a second thickness that is less than the first thickness present on the second metal containing buffer layer, and a second gate conductor contact present on the second titanium nitride layer. Forming an n-type semiconductor device in the n-type region having an n-type work function gate structure comprised of a third high-k gate dielectric present on a channel region of the n-type semiconductor device, a third metal containing buffer layer on the third high-k gate dielectric, a third titanium nitride layer present on the third metal containing buffer layer having a third thickness less than the second thickness, and a third gate conductor fill present atop the third titanium nitride layer.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is relates to forming semiconductor dices, such as planar semiconductor devices, FinFET semiconductor devices, mid gap semiconductor devices, p-type semiconductor devices, and n-type semiconductor devices, in which the work function of the gate structure to the semiconductor devices is adjusted by adjusting the thickness of a titanium nitride layer that is present in the gate structure. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In the following description, the semiconductor device is a field effect transistor.

Complementary metal oxide semiconductor (CMOS) is a type of semiconductor that use both N-type (negative polarity) and P-type (positive polarity) semiconductor circuits.

Typically, since only one of the circuit types is on at any given time, CMOS chips require less power than chips using just one type of transistor. A "field effect transistor" is a transistor in which output current, i.e., source-drain current, is controlled by the voltage applied to a gate structure. A field effect transistor typically has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields.

The term "planar" as used to describe a semiconductor device orientation, e.g., planar FET, denotes that the direction of charge carriers from the source region to the drain region of the semiconductor device is along a plane that is parallel to the upper surface of the substrate, wherein a gate structure is present on the upper surface of the substrate. In a planar semiconductor device, the gate structure does not wrap around the sidewalls of the channel region as in a fin structure.

A FinFET is a field effect transistor in which at least the channel portion of the field effect transistor is present in a fin structure. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure.

Although the present disclosure particularly depicts Fin-FET semiconductor devices and planar semiconductor devices in the provided illustrations, the present disclosure is not limited to only these embodiments, as any semiconductor device that includes a gate structure that may be electrically impacted by work function adjustments is suitable for use with the methods and structures disclosed herein.

The term "work function" is used to describe a gate electrode material that determines the threshold voltage of a semiconductor device. For example, a work function adjustment effectuates a threshold voltage shift either towards the valence band or conduction band. As used herein, "threshold voltage" is the lowest attainable gate voltage that will turn on a semiconductor device, e.g., transistor, by making the channel of the device conductive. A "valence band" is the highest range of electron energies where electrons are normally present at absolute zero.

The "conduction band" is the lowest lying electron energy band of the doped material that is not completely filled with electrons.

It has been determined that in some examples of prior semiconductor devices, a variety of work-function (WF) metals are used in order to obtain the desired work-function on nFET and pFET and mid gap devices in replacement gate integration. However, these work-function metals (WF) alone are not low enough in resistivity and require the use of additional fill metals with low resistivity to be deposited on top of the work-function metal. In current, designs there are about 4 layers to 5 layers of metals being deposited. As the technology is scaled from 32 nm node to 22 nm/15 nm nodes, and beyond it will be extremely challenging to fill the narrow gates with this complicated sandwich stack of metals. Moreover, any solution to the substitution of the 4 or 5 layers of work function metals in increasingly scaled gate structures also needs to be viable for a complementary metal oxide semiconductor (CMOS) technology with about 300 mV to 400 mV separation between the nFET and pFET gate stack at acceptable leakage specifications.

In some embodiments, the methods and structures that are disclosed herein provide a simplified solution of replacement gate integration involving the presence of one work function metal in combination with a barrier metal thereby providing adequate space for fill metals. In one embodiment, a deposition process, such as atomic layer deposition (ALD), is used to form the gate structure layers, i.e., work function adjusting layers, to ensure that uniform and conformal deposition is provided for the gate structure layers. The methods and structures disclosed herein provide a simplified integration strategy for complementary metal oxide semiconductor (CMOS) technology with a 300 mV to 400 mV separation between the different polarity devices, e.g., n-type and p-type devices. Additionally, the methods and structures that are disclosed herein reduce the number of patterned and etch steps to provide differential work functions for the n-type and p-type devices. As will be further discussed below, the methods and structures disclosed herein employ a stack composed of a metal containing buffer layer and a titanium nitride layer, in which the metal containing buffer layer protects an underlying high-k gate dielectric and adjusting the thickness of the titanium nitride layer adjusts the work function to obtain target work functions for n-type semiconductor devices, p-type semiconductor devices and mid gap semiconductor devices.

For example, the titanium nitride layer may be adjusted to have a greatest thickness in the gate structure of the p-type semiconductor device to provide a p-type work function adjustment, and the titanium nitride layer may be adjusted to a least thickness in the gate structure of the n-type semiconductor device to provide an n-type work function adjustment, wherein the titanium nitride layer having the mid gap work function for the mid gap structure has a thickness in between the thickness of the titanium nitride layer of the p-type and n-type devices. As used herein, a "p-type work function" may also be referred to as a high work function, in which the work function is close in value to the valance band. As used herein, an "n-type work function" may also be referred to as a low work function, in which the work function is close in value to a conduction band. As used herein, a "mid gate work function" is a work function typically between the conduction band and the valence band of a semiconductor, such as silicon. In one embodiment, a mid gap gate work function may range from 4.5 eV to 4.6 eV. The methods and structures of the present disclosure are now discussed in greater detail with reference to FIGS. 1A-7B.

Figure 1A:
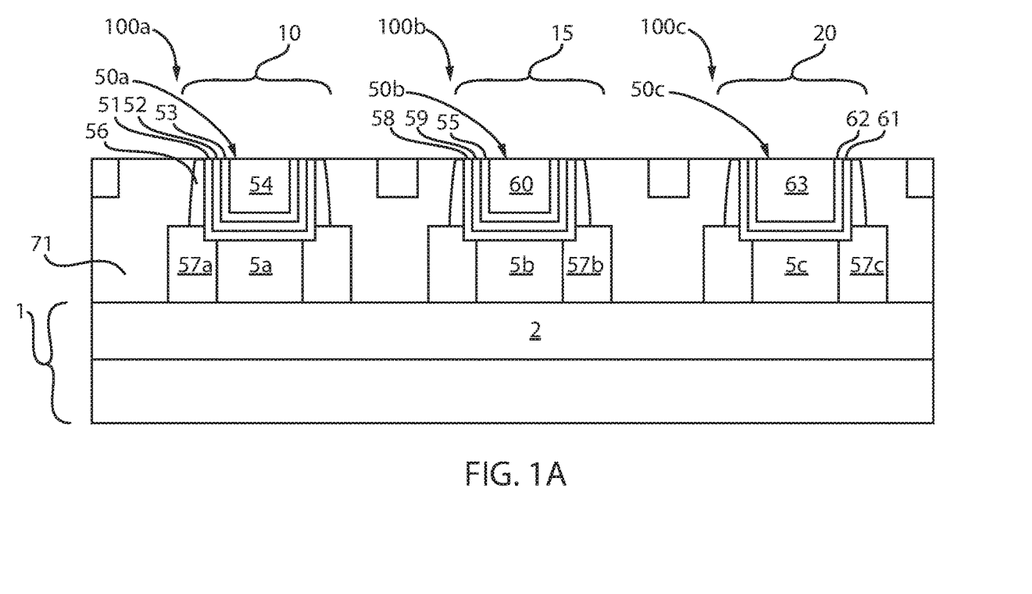
FIG. 1A is a side cross-sectional view of an electrical device including n-type FinFETs, p-type FinFETs and mid gate FinFETs, wherein the gate structures in at least the p-type FinFETs and mid gate FinFETs include a titanium layer having a thickness selected for adjusting the work function of the gate structure, in accordance with one embodiment of the present disclosure.

FIG. 1A depicts one embodiment of an electrical device including Fin Field Effect Transistors (FinFETs) that includes a semiconductor substrate 1 having a p-type region 10, a mid gap region 15, and an n-type region 20. Each of the FinFETs includes a channel region that is present in a fin structure 5a, 5b, 5c. Each fin structure 5a, 5b, 5c may be composed of a semiconductor material. In some embodiments, the fin structures 5a, 5b, 5c are composed of a type IV semiconductor, such as silicon (Si), e.g., single crystal silicon. It is noted that the present disclosure is not limited to only silicon, because other materials may be used for the composition of the fin structures, such as germanium, silicon germanium, and compound semiconductors, such as type III-V semiconductor materials. Each of the fin structures 5a, 5b, 5c are present on a dielectric layer 2, which may be the buried oxide layer of a semiconductor on insulator (SOI) substrate.

A p-type FinFET (p-FinFET) device 100a is present in the p-type region 10 having a p-type work function gate structure 50a present on the channel region of the fin structure 5a in the p-type region 10 of the substrate 1. The p-type work function gate structure 50a may be composed of a high-k gate dielectric 51 that is present on the channel region of the fin structure 5a; first metal containing buffer layer 52 present on the first high-k gate dielectric 51; a first titanium nitride layer 53 having a first thickness present on the first metal containing buffer layer, and a first gate conductor contact 54 present on the first titanium nitride layer 51. The first thickness of the first titanium nitride layer is selected to provide a p-type work function. In some embodiments, the p-type work function gate structure 50a is present on the top surface as well as the sidewall surfaces of the fin structure 5a that is present in the p-type region 10 of the substrate 1.

The term "high-k" denotes that the dielectric constant of the high-k dielectric material, such as the first high-k dielectric 51, is greater than the dielectric constant of silicon oxide at room temperature, e.g., 20° C. to 25° C. In some embodiments, the high-k dielectric material may have a dielectric constant of 4.0 or higher. In another example, the high-k dielectric material may have a dielectric constant greater than 7.0. In one embodiment, the high-k dielectric material for the first high-k dielectric 51 may be an oxide, such as hafnium oxide ($HfO_2$), or the first high-k dielectric 51 may be a nitride, such as silicon nitride, e.g., $Si_3N_4$. In other embodiments, the first high-k dielectric 51 may be selected from BN, $ZrO_2$, $Al_2O_3$, $TiO_2$, $La_2O_3$, $SrTiO_3$, $LaAlO_3$, $Y_2O_3$ and mixtures thereof. The first high-k dielectric 51 may also be selected from hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate ($ZrSiO_x$) and combinations thereof, so long as the material combinations selected provide for etch selectivity in accordance with the following described process flow. The first high-k gate dielectric 51 may have a thickness ranging from 1 nm to 10 nm. In one example, the first high-k gate dielectric 51 has a thickness ranging from 2 nm to 5 nm. In some embodiments, the first high-k gate dielectric 51 is present on the upper surface of the portion of the fin structure 5a that provides the channel region of the device, the sidewall portion of the fins structure 5a, and the sidewalls of the gate spacer, which provides a u-shaped geometry, as depicted in FIG. 1A.

The first metal containing buffer layer 52 may be a metal nitride. For example, the first metal containing buffer layer 52 may be composed of tantalum nitride (TaN). It is noted that the present disclosure is not limited to only tantalum nitride for the composition of the first metal containing buffer layer 52. For example, another metal nitride that is suitable for the first metal containing buffer layer may be tungsten nitride (WN). It is noted that other compositions may also be possible, with one requirement being that the composition of the first metal containing buffer layer 52 may provide that the later deposited titanium nitride layers can be removed selectively to the first metal containing buffer layer 52. The thickness of the first metal containing buffer layer 52 may range from 0.3 nm to 5 nm. In one example, the thickness of the first metal containing buffer layer 52 may range from 2 nm to 5 nm. The first metal containing buffer layer may be in direct contact with the first high-k dielectric layer 51.

In some embodiments, the p-type FinFET (p-FinFET) device 100a may include a first titanium nitride layer 53 having a first thickness to provide a p-type work function. The first titanium nitride layer 53 has a thickness greater than the second titanium nitride layer 55 that is present in the gate structure 50b for the mid gate FinFET 100b, and is greater than the titanium nitride layer (not shown) that is present in the n-type FinFET 100c (when a titanium nitride layer is present in the n-type FinFET). For example, the thickness of the first titanium nitride layer 53 may range from 3 nm to 12 nm. In another example, the thickness of the first titanium nitride layer 53 may range from 5 nm to 10 nm.

A first gate conductor contact 54 may be present on, e.g., in direct contact with, the first titanium nitride layer. The first gate conductor contact 54 may be composed of a gate electrode material such as aluminum (Al), tungsten (W), copper (Cu), as well as other work function adjusting metals, and alloys thereof.

The p-type FinFET (p-FinFET) device 100a may also include gate sidewalls spacers 56 that are present on the sidewalls of the p-type work function gate structure 50a. The gate sidewall spacers 56 may be composed of a dielectric material. P-type conductivity source and drain regions 57 are present on source and drain portions of the fin structure 5a. The p-type source and drain regions 57 may be composed of in situ doped epitaxial semiconductor material that is formed on the fin structures 5a. In some embodiments, the epitaxial semiconductor material may be composed of silicon or silicon germanium.

Still referring to FIG. 1A, the mid gap semiconductor FinFET 100b is present in the mid gap region 15 of the semiconductor substrate 1 having a mid gap gate structure 50b comprised of a second high-k gate dielectric 58, a second metal containing buffer layer 59 present on the second high-k gate dielectric 58, a second titanium nitride layer 55 having a second thickness that is less than the thickness of the first titanium nitride layer 53 present on the second metal containing buffer layer 52, and a second gate conductor contact 60 present on the second titanium nitride layer 55.

The second high-k gate dielectric 58 of the mid gap gate structure 50b is similar to the first high-k gate dielectric layer 51 of the p-type gate structure 50a. Therefore, the description of the first high-k gate dielectric layer 51 of the p-type gate structure 50a may be suitable for describing the second high-k gate dielectric 58 of the mid gap gate structure 50b. For example, the second high-k gate dielectric 58 of the mid gap gate structure 50b may be composed of hafnium oxide and have a thickness ranging from 1 nm to 10 nm. The second high-k gate dielectric 58 may be in direct contact with the channel region portion of the fin structure 5b along the upper surface of the fin structure 5b and the sidewall surfaces of the fin structure 5b. The second high-k gate dielectric 58 may have the same or a different composition than the first high-k gate dielectric 51.

The second metal containing buffer layer 59 of the mid gap gate structure 50b is similar to the first metal containing buffer layer 52 of the p-type gate structure 50a. Therefore, the description of the first metal containing buffer layer 52 of the p-type gate structure 50a may be suitable for describing the second metal containing buffer layer 59 of the mid gap gate structure 50b. For example, the second metal containing buffer layer 59 may be composed of tantalum nitride (TaN), and may have a thickness ranging from 0.3 nm to 5 nm. The second metal containing buffer layer 59 may have the same or a different composition than the first metal containing buffer layer 52.

In some embodiments, the mid gap FinFET (mid gap FinFET) device 100b may include a second titanium nitride layer 55 having a second thickness to provide a mid gap work function. In one example, the thickness of the second titanium nitride layer 55 is selected so that the work function is approximately 4.5 eV to 4.6 eV. The second titanium nitride layer 55 has a thickness that is less than the first titanium nitride layer 53 that is present in the p-type work function gate structure 50a for the p-type FinFET 100a, and is greater than the titanium nitride layer (not shown) that is present in the n-type FinFET 100c (when a titanium nitride layer is present in the n-type FinFET). For example, the thickness of the second titanium nitride layer 55 may range from 1 nm to 3 nm. In one example, the thickness of the second titanium nitride layer 55 may be less than 2 nm. A second gate conductor contact 60 may be present on, e.g., in direct contact with, the second titanium nitride layer 55. The second gate conductor contact 60 may be composed of a gate electrode material such as aluminum (Al), tungsten (W), copper (Cu), as well as other work function adjusting metals, and alloys thereof. The second gate conductor contact 60 may have the same or a different composition than the first gate conductor contact 54.

Similar to the p-type FinFET 100a, the mid gap FinFET 100b also includes a gate sidewall spacer 26 and source and drain regions 27. The source and drain regions 27 for the mid gap FinFET 100b may have an n-type or p-type conductivity. In some embodiments, the source and drain regions 27 may be present on the source and drain region portions of the fin structure 5b in the mid gap region 15 of the substrate 1. The source and drain regions 27 for the mid gap FinFET 100b may be composed of in situ doped epitaxial semiconductor material that is formed on the fin structures 5b. In some embodiments, the epitaxial semiconductor material may be composed of silicon, silicon doped with carbon (Si:C) or silicon germanium.

Still referring to FIG. 1A, an n-type semiconductor device 100c is present in the n-type region 20 having an n-type work function gate structure 50c comprised of a third high-k gate dielectric 61 present on a channel region of the n-type semiconductor device, a third metal containing buffer layer 62 on the third high-k gate dielectric and a third gate conductor fill 63 present atop the third metal containing buffer layer 62.

The third high-k gate dielectric 61 of the n-type gate structure 50c is similar to the first high-k gate dielectric layer 51 of the p-type gate structure 50a, and the second high-k gate dielectric layer 58. Therefore, the description of the first high-k gate dielectric layer 51 of the p-type gate structure 50a may be suitable for describing the third high-k gate dielectric 61 of the n-type gate structure 50c. For example, the third high-k gate dielectric 61 of the n-type gate structure 50c may be composed of hafnium oxide and have a thickness ranging from 1 nm to 10 nm. The third high-k gate dielectric 61 may be in direct contact with the channel region portion of the fin structure 5c along the upper surface of the fin structure 5c and the sidewall surfaces of the fin structure 5c. The third high-k gate dielectric 61 may have the same or a different composition than the first high-k gate dielectric 51, and may have the same or different composition than the second high-k gate dielectric 58.

The third metal containing buffer layer 62 of the mid gap gate structure 50c is similar to the first metal containing buffer layer 52 of the p-type gate structure 50a. Therefore, the description of the first metal containing buffer layer 52 of the p-type gate structure 50a may be suitable for describing the third metal containing buffer layer 62 of the n-type gate structure 50c. For example, the third metal containing buffer layer 62 may be composed of tantalum nitride (TaN), and may have a thickness ranging from 0.3 nm to 5 nm. The third metal containing buffer layer 62 may have the same or a different composition than the first metal containing buffer layer 52, and may have the same or a different composition than the second metal containing buffer layer 59.

In some embodiments, the n-type work function gate structure 50c of the n-type FinFET device 100c may not include, i.e., is entirely free, of a titanium nitride layer. As indicated above, both the p-type work function gate structure 50a of the p-type FinFET 100a and the mid gap work function gate structure 50b of the mid gap FinFET 100b include titanium nitride layers 53, 55 having thicknesses adjusted to provide a work function that is optimal for the p-type FinFET 100a and the mid gap FinFET 100b. In some embodiments of the n-type work function gate structure 50c the third gate conductor contact 63 is in direct contact with the third metal containing buffer layer 62. In some embodiments, the n-type work function gate structure 50c provides an n-type work function without a titanium nitride layer. In other embodiments, the n-type work function gate structure 50c includes a third titanium nitride layer (not shown) that is present between the third metal containing buffer layer 62 and the third gate conductor contact 63. In these embodiments, the thickness, i.e., third thickness, of the third titanium nitride layer is less than the thickness, i.e., second thickness, of the second titanium nitride layer 55 that is present in the n-type work function gate structure 50b. For example, the thickness of the third titanium nitride layer 55 may range from 0 nm to 1 nm.

A third gate conductor contact 64 may be present on, e.g., in direct contact with, the second titanium nitride layer 55. The third gate conductor contact 64 may be composed of a gate electrode material such as aluminum (Al), tungsten (W), copper (Cu), as well as other work function adjusting metals, and alloys thereof. The third second gate conductor contact 64 may have the same or a different composition than the first gate conductor contact 54

It is noted that the FinFETs depicted in FIG. 1A are only one embodiment of the present disclosure. The p-type work function gate structure 50a, the mid gap work function gate structure 50b and the n-type work function gate structure 50c that are depicted in FIG. 1A are equally suitable for planar semiconductor devices, such as field effect transistors (FETs) formed on bulk semiconductor substrates, FETs formed on semiconductor on insulator (SOI) substrates, and FETs formed on extremely thin semiconductor on insulator (ETSOI) substrates, as depicted in FIG. 1B.

Semiconductor on insulator (SOI) substrate included a base supporting semiconductor layer; a dielectric layer present on the base supporting semiconductor layer, e.g., a buried oxide layer; and an upper semiconductor layer that is present on the dielectric layer, which may be referred to as an SOI layer, and may be composed of silicon (Si). Extremely thin semiconductor on insulator (ETSOI) substrates are a form of SOI substrates. In ETSOI substrates, the thickness of the SOI layer is less than 10 nm, and typically less than 5 nm. Referring to FIG. 1B, it is noted that the portion of the semiconductor substrate 1 in which the semiconductor devices are formed may be composed of silicon, germanium, silicon germanium, and compound semiconductors, such as type III-V semiconductor materials.

Figure 1B:
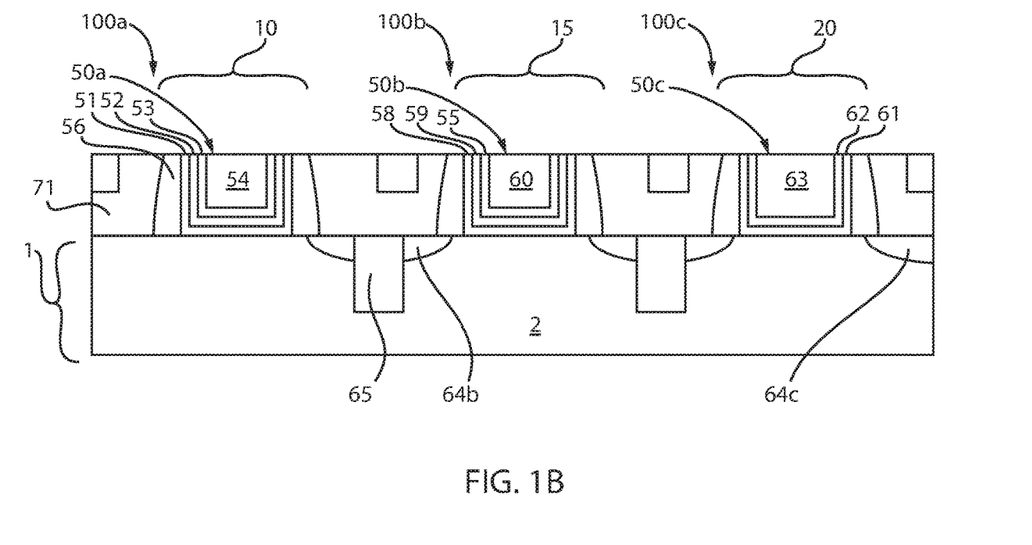
FIG. 1B is a side cross-sectional view of an electrical device including n-type planar semiconductor devices, p-type planar semiconductor devices and mid gate planar semiconductor devices, wherein the gate structures in at least the p-type planar devices and the mid gate planar devices include a titanium layer having a thickness selected for adjusting the work function of the gate structure, in accordance with one embodiment of the present disclosure.

FIG. 1B depicts one embodiment of an electrical device including p-type planar semiconductor devices 100d, mid gate planar semiconductor devices 100e and mid gate planar semiconductor devices 100f. Each of the p-type planar semiconductor device 100d, the mid gap planar semiconductor device 100e and the n-type planar semiconductor device 100f are hereafter referred to as being field effect transistors (FETs).

The gate structure for the p-type FET 100d is a p-type work function gate structure 50a that is present on the channel region of the upper surface of the semiconductor substrate 1 in the p-type region of the substrate 1. The material layers and composition of the material layers in the p-type work function gate structure 50a of the p-type FET 100d is similar to the material layers and composition of the p-type work function gate structure 50a of the p-type FinFET 100a. For example, the p-type work function gate structure 50a of p-type FET 100d may be composed of a high-k gate dielectric 51 that is present on the channel region of the semiconductor substrate 1 in the p-type region 10; a first metal containing buffer layer 52 present on the first high-k gate dielectric 51; a first titanium nitride layer 53 having a first thickness present on the first metal containing buffer layer, and a first gate conductor contact 54 present on the first titanium nitride layer 51. The first thickness of the first titanium nitride layer is selected to provide a p-type work function. Each of the aforementioned layers have been described above in the description of the layers having the same reference numbers for the p-type work function gate structure 50a of the p-type FinFET 100a.

In one example, the p-type work function gate structure 50a of the p-type FET 100d includes a first high-k gate dielectric 51 of hafnium oxide having a thickness ranging from 1 nm to 10 nm; a first metal containing buffer layer 52 composed of tantalum nitride (TaN) and having a thickness ranging from 0.3 nm to 5 nm; a first titanium nitride layer 53 having a thickness selected to provide a p-type work function; and a gate conductor contact 64 composed of a metal such as copper, aluminum or tungsten. The thickness of the first titanium nitride layer 53 may range from 3 nm to 12 nm in order to provide a p-type work function.

The p-type FET 100d may also include gate sidewalls spacers 56 that are present on the sidewalls of the p-type work function gate structure 50a. P-type conductivity source and drain regions 64 are present in the semiconductor substrate 1 on opposing sides of the p-type work function gate structure 50a. In some embodiments, the source and drain regions 64 may be raised by forming epitaxial semiconductor material on the upper surface of the semiconductor substrate 1.

The gate structure for the mid gap FET 100e is a mid gap work function gate structure 50b that is present on the channel region of the upper surface of the semiconductor substrate 1 in the p-type region of the substrate 1. The material layers and composition of the material layers in the mid gap work function gate structure 50b of the mid gap FET 100e is similar to the material layers and composition of the mid gap work function gate structure 50b of the mid gap FinFET 100b. For example, the mid gap gate structure 50e of mid gap FET 100e may be composed of a second high-k gate dielectric 58 that is present on the channel region of the semiconductor substrate 1 in the mid gap region 15; a second metal containing buffer layer 59 present on the second high-k gate dielectric 58; a second titanium nitride layer 55 having a second thickness present on the second metal containing buffer layer, and a second gate conductor contact 50 present on the second titanium nitride layer 55. The second thickness of the first titanium nitride layer is selected to provide a mid gap work function. Each of the aforementioned layers have been described above in the description of the layers having the same reference numbers for the mid gap work function gate structure 50b of the mid gap FinFET 100b.

In one example, the mid gap work function gate structure 50b of the mid gap FET 100e includes a first high-k gate dielectric 58 of hafnium oxide having a thickness ranging from 1 nm to 10 nm; a second metal containing buffer layer 59 composed of tantalum nitride (TaN) and having a thickness ranging from 0.3 nm to 5 nm; a second titanium nitride layer 55 having a thickness selected to provide a mid gap work function; and a gate conductor contact 60 composed of a metal such as copper, aluminum or tungsten. The thickness of the second titanium nitride layer 55 may range from 1 nm to 3 nm in order to provide a mid gap work function. The thickness of the second titanium nitride layer 55 is less than the thickness of the titanium nitride layer, i.e., first titanium nitride layer 53, in the p-type work function gate 50a, and is greater than the thickness of the third titanium layer (not shown) in the n-type work function gate structure 50c.

The mid gap FET 100e may also include gate sidewalls spacers 56 that are present on the sidewalls of the mid gap gate structure 50b. P-type conductivity source and drain regions 64b or n-type source and drain regions are present in the semiconductor substrate 1 on opposing sides of the mid gap work function gate structure 50b. In some embodiments, the source and drain regions 64b may be raised by forming epitaxial semiconductor material on the upper surface of the semiconductor substrate 1.

The gate structure for the n-type FET 100f is an n-type work function gate structure 50c that is present on the channel region of the upper surface of the semiconductor substrate 1 in the n-type region 20 of the substrate 1. The material layers and composition of the material layers in the n-type work function gate structure 50c of the n-type FET 100f are similar to the material layers and composition of the n-type work function gate structure 50c of the n-type FinFET 100c. For example, the n-type work function gate structure 50c of p-type FET 100e may be composed of a third high-k gate dielectric 61 that is present on the channel region of the semiconductor substrate 1 in the n-type region 20; a third metal containing buffer layer 62 present on the third high-k gate dielectric 51; and a third gate conductor contact 63 present on the third metal containing buffer layer 62. In some embodiments of the n-type work function gate structure 50c the third gate conductor contact 63 is in direct contact with the third metal containing buffer layer 62.

In one example, the n-type work function gate structure 50c of the n-type FET 100f includes a third high-k gate dielectric 61 of hafnium oxide having a thickness ranging from 1 nm to 10 nm; a third metal containing buffer layer 62 composed of tantalum nitride (TaN) and having a thickness ranging from 0.3 nm to 5 nm; and a gate conductor contact 63 composed of a metal such as copper, aluminum or tungsten.

In some embodiments, the n-type work function gate structure 50c of the n-type FET 100f provides an n-type work function without a titanium nitride layer. In other embodiments, the n-type work function gate structure 50c includes a third titanium nitride layer (not shown) that is present between the third metal containing buffer layer 62 and the third gate conductor contact 63. In these embodiments, the thickness, i.e., third thickness, of the third titanium nitride layer is less than the thickness, i.e., second thickness, of the second titanium nitride layer 55 that is present in the n-type work function gate structure 50b. For example, the thickness of the third titanium nitride layer 55 may range from 0 nm to 1 nm.

The n-type FET 100f may also include gate sidewalls spacers 56 that are present on the sidewalls of the n-type work function gate structure 50c. N-type conductivity source and drain regions 64c are present in the semiconductor substrate 1 on opposing sides of the n-type work function gate structure 50c. In some embodiments, the source and drain regions 64c may be raised by forming epitaxial semiconductor material on the upper surface of the semiconductor substrate 1.

Isolation between the p-type FET 100d, the mid gap FET 100e and the n-type FET 100f may be provided by an isolation region 65 positioned between the aforementioned devices. The isolation region 65 may be a trench isolation region filled with a dielectric material, such as silicon oxide.

It is noted that although FIG. 1B depicts a bulk semiconductor substrate, the p-type FET 100d, the mid gap FET 100e, and the n-type FET 100f may also be formed on an SOI substrate or an ETSOI substrate. Additionally, it is not necessary that each of the p-type FinFET 100a, the mid gap FinFET 100b, the n-type FinFET 100c, the p-type FET 100d, the mid gap FET 100e, and the n-type FET 100f are present on the same substrate 1, as the any of the aforementioned devices may be present on the same substrate in any combination.

Further details regarding the structures depicted in FIGS. 1A and 1B may be provided in the following description of a method of forming semiconductor devices in which the work function of a gate structure may be adjusted by adjusting the thickness of titanium nitride layers within the gate structures. FIGS. 2A-6A illustrate one embodiment of forming FinFET type devices, such as the FinFETs depicted in FIG. 1A. FIGS. 2B-6B illustrate one embodiment of forming planar FET devices, such as the FETs depicted in FIG. 1B.

Figure 2A:
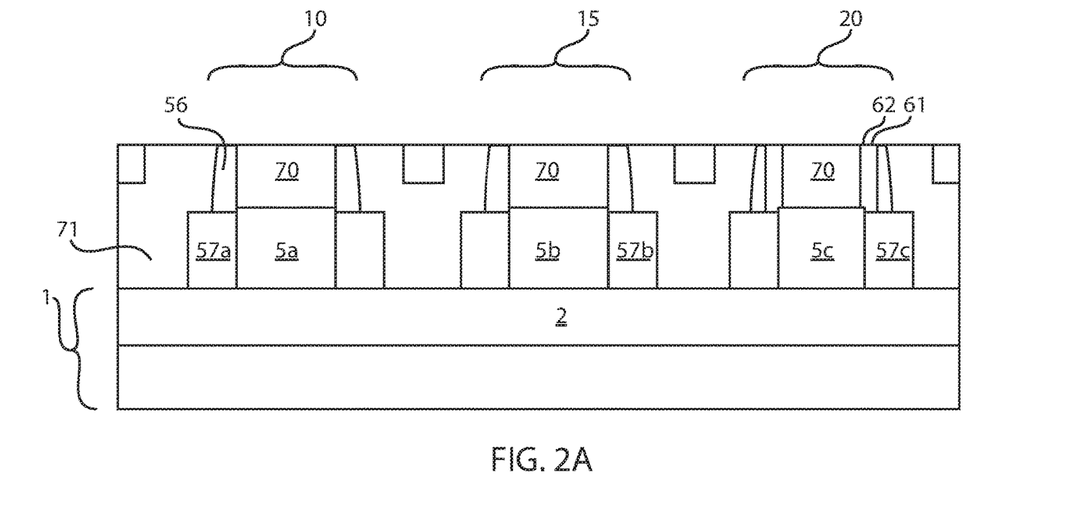
FIG. 2A is a side cross-sectional view (i.e., cross sectional along a length of the fin structure) depicting forming a sacrificial gate structure on a plurality of fin structures, in which one of the fin structures is for n-type device, one of the fin structures is for a p-type device and one of the fin structures is for a mid gap device in accordance with one embodiment of the present disclosure.

FIG. 2A depicts one embodiment of forming a sacrificial gate structure 70 on a plurality of fin structures 5a, 5b, 5c, in which one of the fin structures 5a is for p-type FinFET device 100a, one of the fin structures 5b is for a mid gap finFET device 100b and one of the fin structures 5c is for an n-type device 100c. The fin structures 5a, 5b, 5c may be formed from a semiconductor substrate 1 using patterning and etching, e.g., spacer image transfer (SIT) processing. The fin structures 5a, 5b, 5c may have a height ranging from 5 nm to 200 nm. In another embodiment, the fin structures 5a, 5b, 5c may have a height ranging from 10 nm to 100 nm. The fin structures 5a, 5b, 5c may each have a width of less than 20 nm. In another embodiment, the fin structures 5a, 5b, 5c have a width ranging from 5 nm to 20 nm.

The sacrificial gate structure 70 is an element of a replacement gate process. The term "sacrificial" as used to describe the replacement structure denotes that the structure is present during the process sequence, but is not present in the final device structure, in which the sacrificial structure provides an opening that dictates the size and geometry of a later formed functional gate structure. In some embodiments, the sacrificial gate structures 70 that are depicted in FIG. 2A are formed of a semiconductor material, such as polysilicon. But, in other embodiments, the sacrificial gate structures 70 may be composed of a dielectric material. The sacrificial gate structures 70 may be formed using deposition, photolithography and etching processes. The sacrificial gate structures 70 are formed to have a geometry that matches the geometry of the later formed functional gate structures. In the embodiment that is depicted in FIG. 2A, a sacrificial gate structure 70 is formed for each fin structure 5a, 5b, 5c for each of the p-type FinFET 100a, the mid gap FinFET 100b, and the n-type FinFET 100c.

Figure 2B:
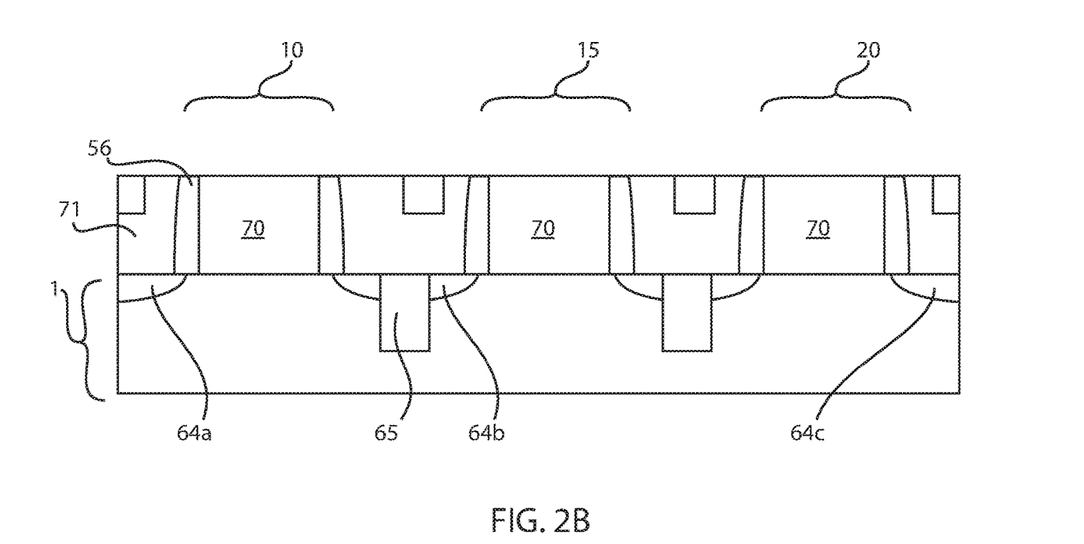
FIG. 2B is a side cross-sectional view depicting one embodiment of a sacrificial gate structure on a plurality of regions of a semiconductor substrate for forming planar semiconductor devices, in which one of the sacrificial gate structures is present on a channel region for an n-type device, one of the sacrificial gate structures is present on a channel region for a p-type device and one of the sacrificial gate structure is for a mid gap device.

FIG. 2B depicts forming the sacrificial gate structure 70 on the channel region of the p-type region 10, mid gap region 15 and the n-type region 20 of the semiconductor substrate 1 for the planar devices. e.g., p-type FET 100d, mid gap FET 100e and n-type FET 100f.

Referring to FIGS. 2A and 2B, a gate sidewall spacer 56 may then be formed on each of the sacrificial gate structures 70. The gate sidewall spacer 56 may be composed of oxide, i.e., $SiO_2$, but may also comprise nitride or oxynitride materials. Each gate sidewall spacer 56 can be formed by deposition and etch processes.

FIG. 2A also depicted forming the source and drain regions 57a, 57b, 57c on opposing sides of the sacrificial gate structures 70 that are present in the p-type region 10, mid gap region 15 and the n-type region 20. The source and drain regions 57a, 57b, 57c are formed on the source and drain region portions of the fin structures 5a, 5b, 5c. The conductivity type of the source and the drain regions typically dictates the conductivity type of the semiconductor device. The term "conductivity type" refers to whether the device is n-type or p-type. The conductivity type of the source and drain regions typically dictate the conductivity type of the device. For example, if the source and drain regions are doped to an n-type conductivity, the semiconductor device may be referred to as an n-type conductivity device, such as an n-FinFET, and if the source and drain regions are doped to a p-type conductivity, the semiconductor device may be referred to as a p-type conductivity device, such as a p-FinFET. As used herein, "n-type" refers to the addition of impurities that contributes free electrons to an intrinsic semiconductor. As used herein, "p-type" refers to the addition of impurities to an intrinsic semiconductor that creates deficiencies of valence electrons.

The source and drain regions 57a, 57b, 57c may be formed by ion implanting n-type or p-type dopant into the source and drain region portions of the fin structures 5a, 5b, 5c. The source and drain regions 57a, 57b, 57c may also be formed by forming in-situ doped n-type or p-type conductivity epitaxial semiconductor material on the source and drain region portions of the fin structures 30a, 30b. In some embodiments, a combination of ion implantation and in-situ doped n-type or p-type conductivity epitaxial semiconductor material may be employed to form the source and drain regions 57a, 57b, 57c. Block masks may be utilized to isolate specific fin structures 30a, 30b for each conductivity type doping required. As explained above, the source and drain regions 57a in the p-type region 10 are doped to a p-type conductivity; the source and drain regions 57b in the mid gap region 15 are doped to an n-type or p-type conductivity; and the source and drain regions 57c in the m-type region 20 are doped to an n-type conductivity. The concentration of dopant within the source and drain regions 57a, 57b, 57c is typically present in a concentration ranging from about $10^{11}$ to about $10^{15}$ atoms/cm$^2$, with a concentration of dopant within the doped region from about $10^{11}$ to about $10^{13}$ atoms/cm$^2$ being more typical.

FIG. 2B depicts implanting dopants into the semiconductor substrate 1 to form the source and drain regions 65a, 65b, 65c of planar semiconductor devices, e.g., the planar p-type FET 100e, the planar mid gap FET 100f, and the planar n-type FET 100g. The source regions and drain regions 65a, 65b, 65c for the planar semiconductor devices are formed ion implantation. Block masks may be utilized to isolate specific regions, e.g., p-type region 10, mid gap region 15 and n-type region 20, for each conductivity type doping required. Although FIG. 2B only depicts forming source and drain regions 65a, 65b, 65c within the surface of the substrate 10, the present disclosure is not limited to only this example. For example, raised source and drain regions (not shown) may be present on the upper surfaces of the semiconductor substrate on opposing sides of the sacrificial gate structure 70. The raised source and drain regions may be formed of epitaxially deposited semiconductor material and may have the same dopant conductivity as the source and drain regions 65a, 65b, 65c that the epitaxial material is formed on.

The method may continue with activating the source and drain regions 57a, 57b, 57c, 65a, 65b, 65c. Activation of the source and drain regions 57a, 57b, 57c, 65a, 65b, 65c may be done with the sacrificial gate structure 70 present on the substrate 1. This provides that the later formed functional gate structure is not subjected to the high temperature anneal process.

FIGS. 2A and 2B also depict forming an interlevel dielectric layer 71 having an upper surface that is coplanar with the upper surface of the sacrificial gate structure 70. The interlevel dielectric layer 71 may be deposited using chemical solution deposition, spin on deposition, chemical vapor deposition or a combination thereof. The interlevel dielectric layer 71 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 71 include any of the aforementioned materials in porous form, or in a form that changes during processing to or from being porous and/or permeable to being non-porous and/or non-permeable. Following deposition, the interlevel dielectric layer 71 may be planarized to provide an upper surface that is coplanar with an exposed upper surface of the replacement gate structures 70. In one example, the planarization process is chemical mechanical planarization (CMP).

Figure 3A:
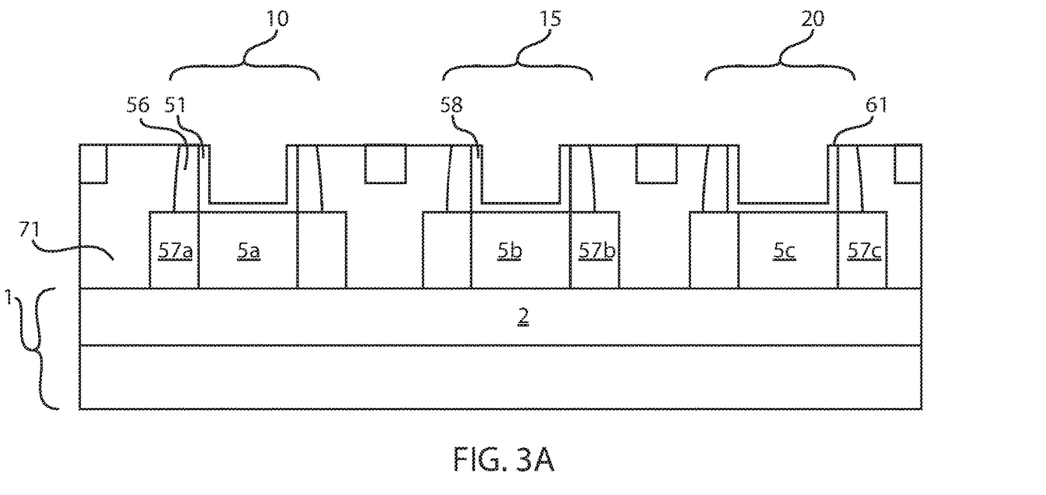
FIG. 3A is a side cross-sectional view depicting removing the sacrificial gate structure from the structure depicted in FIG. 2A, and forming a high-k gate dielectric on each of the fin structures for the p-type FinFET, the mid gap FinFET and the n-type FinFET.
Figure 3B:
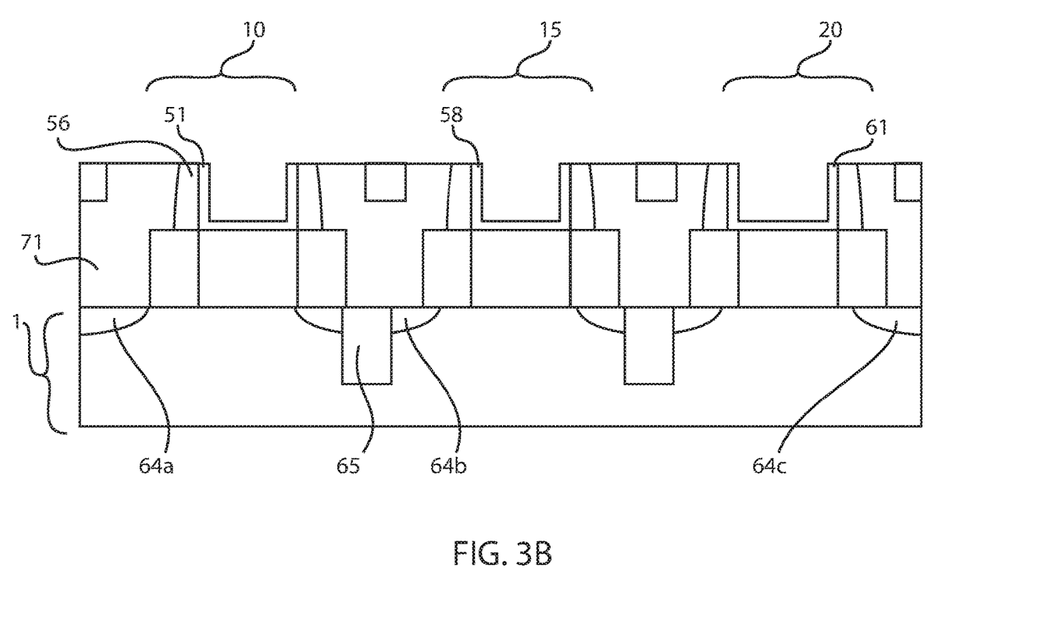
FIG. 3B is a side cross-sectional view depicting removing the sacrificial gate structure from the structure depicted in FIG. 2B, and forming a high-k gate dielectric on each of the channel regions for the planar p-type FET, the planar mid gap FET and the planar n-type FET.

FIGS. 3A and 3B depicting removing the sacrificial gate structure from the structures depicted in FIGS. 2A and 2B. Once, the sacrificial gate structures 70 are exposed by the aforementioned chemical mechanical planarization (CMP) process, they may be removed using a selective etch process. As used herein, the term "selective" in reference to a material removal process denotes that the rate of material removal for a first material is greater than the rate of removal for at least another material of the structure to which the material removal process is being applied. In some embodiments, the sacrificial gate structures 70 are removed by an etch that is selective to the interlevel dielectric, the gates sidewall spacers 56, and the semiconductor structure that the channel region is present therein, such as the fin structures 5a, 5b, 5c, as depicted in FIG. 3A, or the semiconductor substrate 1, as depicted in FIG. 3B. The etch process may be an anisotropic etch, such as reactive ion etch, or an isotropic etch, such as a wet chemical etch. Removing the sacrificial gate structures 70 provides a gate opening to the channel regions of the devices.

FIG. 3A depicts forming a first high-k dielectric 51, second high-k dielectric 58, and a third high-k dielectric 61 on each of the fin structures 5a, 5b, 5c for the p-type FinFET 100a, the mid gap FinFET 100b and the n-type FinFET 100c. In some embodiments, the first high-k dielectric 51, the second high-k dielectric 58, and the third high-k dielectric 61 is formed using a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The first high-k dielectric 51, the second high-k dielectric 58, and the third high-k dielectric 61 may also be formed utilizing any combination of the above processes. The high-k dielectrics are typically deposited as a conformal layer using a conformal deposition process. The term "conformal" denotes a layer having a thickness that does not deviate from greater than or less than 30% of an average value for the thickness of the layer. The material layer for the first high-k dielectric 51, the second high-k dielectric 58, and the third high-k dielectric 61 may be a blanket deposited layer that is formed on the upper surface of the interlevel dielectric layer 71; the sidewall surface of the gate sidewall spacer 56 that provides the sidewall of the gate opening; and the base of the gate opening provided by the channel region of the devices, i.e., p-type FinFET 100a, mid gap FinFET 100b and the n-type FinFET 100c. The portion of the material layer that is present on the upper surface of interlevel dielectric 71 that provides the first high-k dielectric 51, the second high-k dielectric 58, and the third high-k dielectric 61 may be removed by a planarization process, such as chemical mechanical planarization (CMP).

The high-k gate dielectric layer 51' may be composed of a single composition high-k dielectric layer that provides the same composition for the each of the p-type FinFET 100a, the mid gap FinFET 100b and the n-type FinFET 100c. In some embodiments, the material layers for the high-k dielectric layer for each of the p-type FinFET 100a, the mid gap FinFET 100b and the n-type FinFET 100c may be formed independently from one another. This can be accomplished using block masks, as described in the above embodiments. By employing block masks, at least one of the material layers for at least one of the p-type FinFET 100a, the mid gap FinFET 100b and the n-type FinFET 100c may have a composition that is different than the material layers in the remaining p-type FinFET 100a, the mid gap FinFET 100b and the n-type FinFET 100c.

FIG. 3B depicts forming a high-k gate dielectric 51' on each of the channel regions for the planar p-type FET 100e, the planar mid gap FET 100f and the planar n-type FET 100g. The description of the high-k gate dielectric 51' described with reference to FIG. 3A is suitable for the description of the high-k gate dielectric 51' that is depicted in FIG. 3B.

Figure 4A:
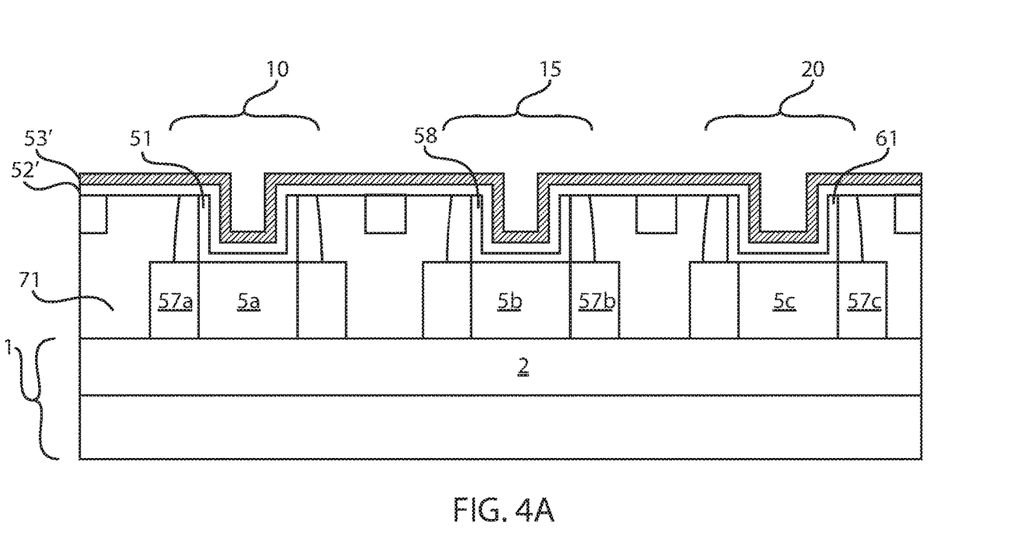
FIG. 4A is a side cross-sectional view forming a gate stack of a metal containing buffer layer on the high-k gate dielectric depicted in FIG. 3A and a first titanium nitride layer having a first thickness on the metal buffer layer.

FIG. 4A depicts forming a gate stack of a metal containing buffer layer 52' on the high-k gate dielectric 51' depicted in FIG. 3A and a first titanium nitride layer 53' having a first thickness on the metal buffer layer 52'. The thickness of the first titanium nitride layer 53' is typically selected to provide a p-type work function for the p-type work function gate structure 50a of the p-type FinFET 100a. As will be discussed in greater detail below, the thickness of the first titanium nitride layer 53' may be reduced or removed from the regions of the substrate, in which the mid gap FinFET 100b and the n-type FinFET 100c are present. For example, in the mid gap region 15 the first titanium nitride layer 53' may be patterned and etched to have a second thickness that is less than the thickness of the portion of the first titanium nitride layer 53' that is present in the p-type region 10 of the substrate; and to have a greater thickness than the portion of the first titanium nitride layer 53' that is present in the n-type region 20 of the substrate, i.e., if the first titanium nitride layer 53' that is removed in its entirety from the n-type region 20.

The metal containing buffer layer 52' may be a metal nitride. For example, the metal containing buffer layer 52' may be composed of tantalum nitride (TaN). The thickness of the metal containing buffer layer 52' may range from 0.3 nm to 5 nm. In one example, the thickness of the metal containing buffer layer 52' may range from 3 nm to 5 nm. The metal containing buffer layer 52' may be conformally deposited directly on the high-k dielectric layer 51'. The metal containing buffer layer 52' may be a blanket deposited layer that is formed over the upper surface of the interlevel dielectric layer 71; the sidewall surface of the gate sidewall spacer 56 that provides the sidewall of the gate opening; and the base of the gate opening provided by the channel region of the devices, i.e., p-type FinFET 100a, mid gap FinFET 100b and the n-type FinFET 100c. The metal containing buffer layer 52' may be deposited using atomic layer deposition (ALD). The metal containing buffer layer 52' may also be formed using a physical vapor deposit (PVD) process, such as sputtering or plating. In other embodiments, the metal containing buffer layer 52' may also be deposited using chemical vapor deposition, such as plasma enhanced chemical vapor deposition (PECVD).

The first titanium nitride layer 53' may be conformally deposited directly on the metal containing buffer layer 52'. The first titanium nitride layer 53' may be a blanket deposited layer that is formed directly on the metal containing buffer layer 52', and over the upper surface of the interlevel dielectric layer 71; the sidewall surface of the gate sidewall spacer 56 that provides the sidewall of the gate opening; and the base of the gate opening provided by the channel region of the devices, i.e., p-type FinFET 100a, mid gap FinFET 100b and the n-type FinFET 100c. The first titanium nitride layer 53' may be deposited using atomic layer deposition (ALD). The first titanium nitride layer 53' may also be formed using a physical vapor deposit (PVD) process, such as sputtering or plating. In other embodiments, the first titanium nitride layer 53' may also be deposited using chemical vapor deposition, such as plasma enhanced chemical vapor deposition (PECVD).

Figure 4B:
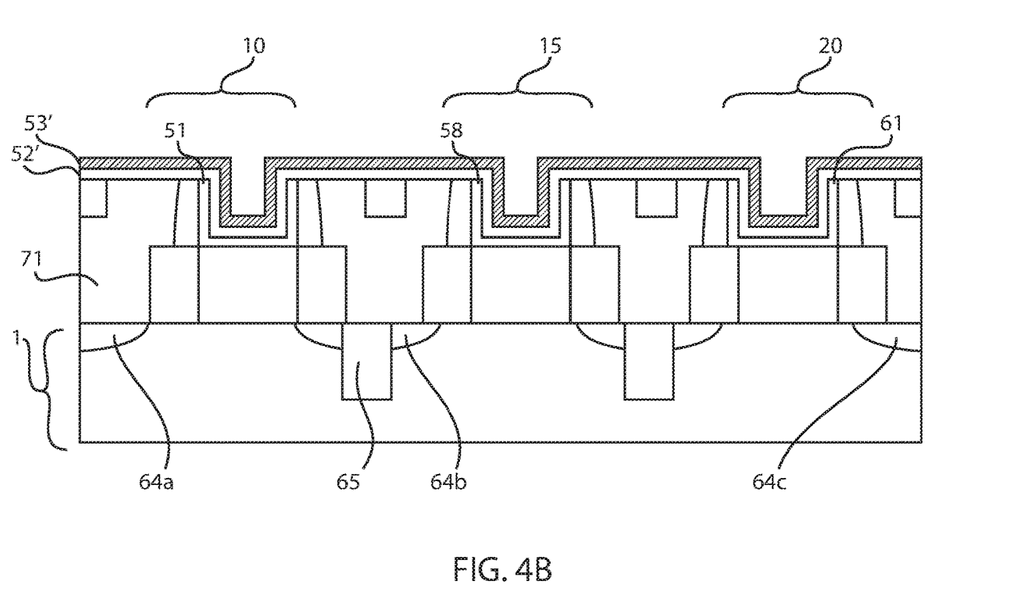
FIG. 4B is a side cross-sectional view forming a gate stack of a metal containing buffer layer on the high-k gate dielectric depicted in FIG. 3B and a first titanium nitride layer having a first thickness on the metal containing buffer layer.

FIG. 4B depicts forming a gate stack of a metal containing buffer layer 52' on the high-k gate dielectric 51, 58, 61 of the planar p-type FET 100a, the planar mid gap FET 100b, and the n-type FET 100c that is depicted in FIG. 3B. FIG. 4B also depicts forming a first titanium nitride layer 53' having a first thickness on the metal containing buffer layer 52'. The metal containing buffer layer 52' and the first titanium nitride layer 53' have been described in FIG. 4A.

Figure 5A:
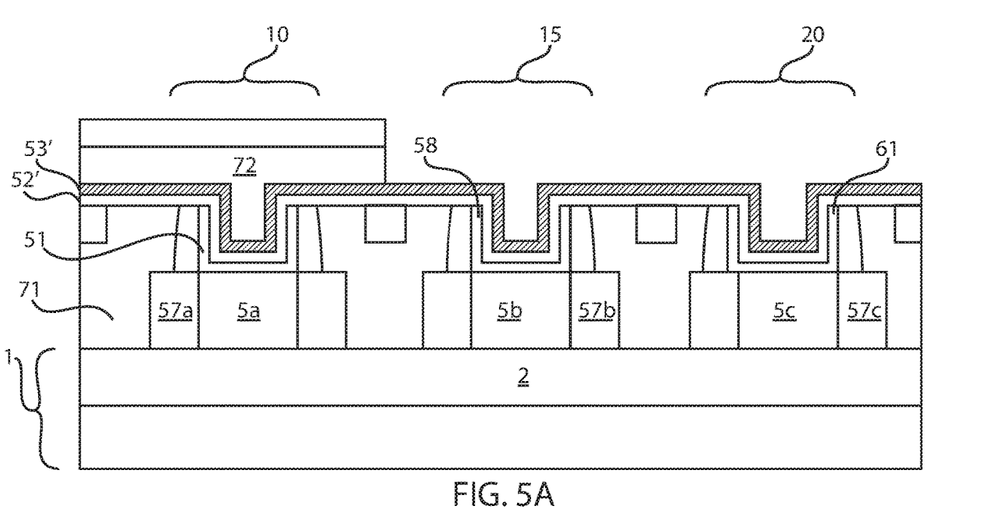
FIG. 5A is a side cross-sectional view depicting forming a block mask over the portion of first titanium nitride that is present on the fin structure for the p-type FinFET that is depicted in FIG. 4A, in accordance with one embodiment of the present disclosure.

FIG. 5A depicts forming a block mask 72 over the portion of first titanium nitride 53' that is present on the fin structure 5a for the p-type FinFET 100a in the p-type region 10 of the substrate 1. The block mask 72 does not cover the portions of the first titanium nitride layer 53' that are present in the mid gap region 15 and n-type region 20 of the substrate 1, leaving these portions of the first titanium nitride layer 53' exposed. The block mask 72 may comprise soft and/or hardmask materials and can be formed using deposition, photolithography and etching. In one embodiment, the block mask 72 comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

Figure 5B:
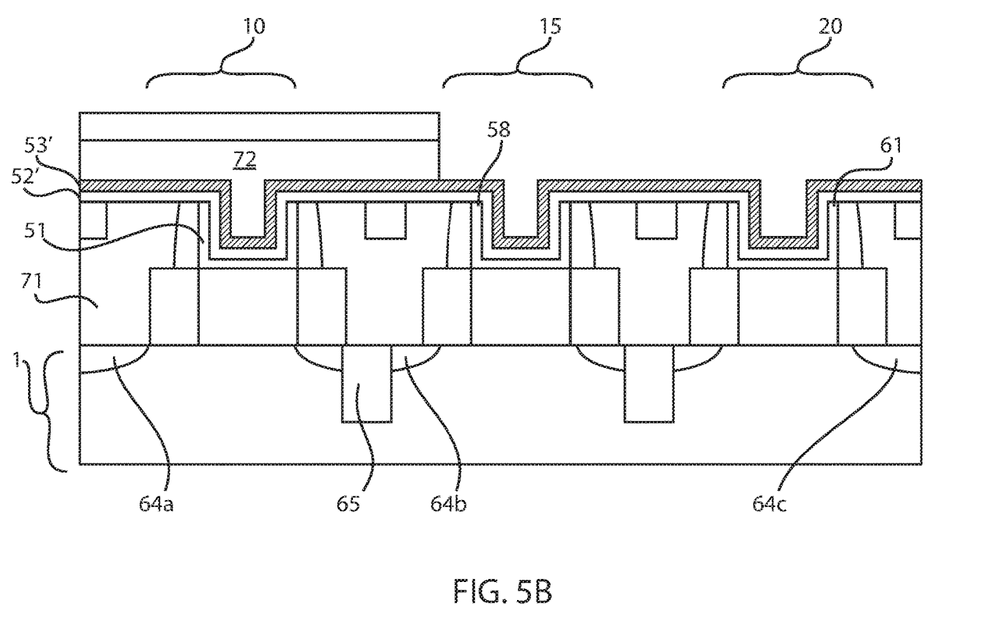
FIG. 5B is a side cross-sectional view depicting forming a block mask over the portion of first titanium nitride that is present over the channel region for the p-type planar device that is depicted in FIG. 4B, in accordance with one embodiment of the present disclosure.

FIG. 5B depicting forming a block mask 72 over the portion of first titanium nitride 53' that is present over the channel region for the p-type planar device 100e that is depicted in FIG. 4B. The block mask 72 has been described above with reference to FIG. 5A.

Figure 6A:
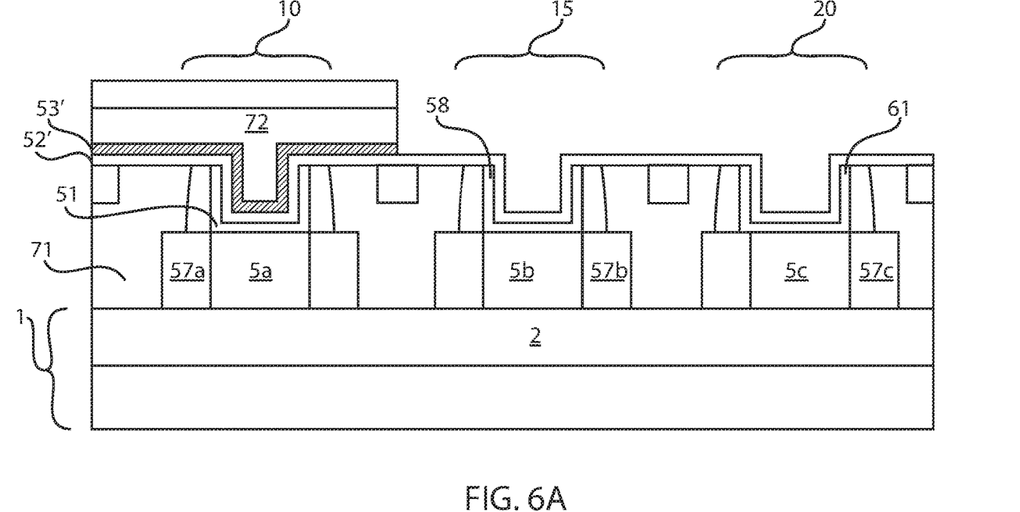
FIG. 6A is a side cross-sectional view depicting removing the first titanium nitride layer from the channel region of the fin structures for the mid gap device and the n-type device of the structures depicted in FIG. 5A, in accordance with one embodiment of the present disclosure.

FIG. 6A depicts removing the exposed portions of the first titanium nitride layer 53' from the mid gap region 15 of the substrate 1, and the n-type region 20 of the substrate, while the portion of the first titanium nitride layer 53' that is present in the p-type region 10 of the substrate 1 is protected by the block mask 72. The exposed portions of the first titanium nitride layer 53' are removed by an etch process that is selective to the underlying metal containing buffer layer 52'. The etch process for removing the exposed portions of the first titanium nitride layer 53' may be an isotropic etch, such as a wet chemical etch, and/or an anisotropic etch, such as reactive ion etching. In one example, when the metal containing buffer layer 52' is composed of tantalum nitride (TaN), the exposed portions of the first titanium nitride layer 53' may be removed by a peroxide based etch chemistry, such as peroxide 60:1 at 65° C. The portion of the first titanium nitride layer 53' remains in the p-type region 10 of the substrate having a thickness that is suitable for the first titanium nitride layer 53 of the functional gate structure for the p-type FinFET 100a. In some embodiments, instead of removing the first titanium nitride layer 53' in its entirety from the mid gap region 15 and the n-type region 20 of the substrate 1, the exposed portion of the first titanium nitride layer 53' may be etched to reduce its thickness to a second thickness that provides a mid gap work function for the mid gap FinFET 100b that is present in the mid gap region 15 of the semiconductor substrate 1. Additionally, in some embodiments, the portion of the first titanium nitride layer 53' may not be entirely removed from the n-type region 20 of the substrate 1, but recessed to a third thickness that produces an n-type work function for the n-type FinFET 100c, in which the third thickness is less than the aforementioned second thickness that produces a mid gap work function for the mid gap FinFETs 100b.

Figure 6B:
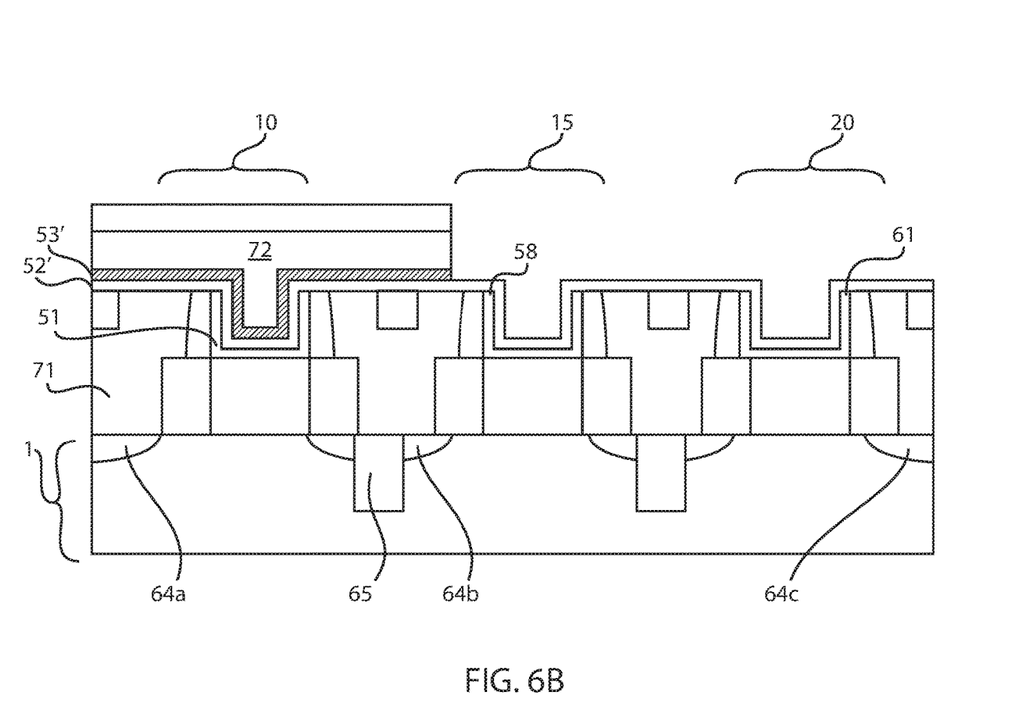
FIG. 6B is a side cross-sectional view depicting removing the first titanium nitride layer from the channel region of the planar FETs for the mid gap device and the n-type device of the structures depicted in FIG. 5B, in accordance with one embodiment of the present disclosure.

FIG. 6B depicts removing the first titanium nitride layer 53' from the mid gap region 15 and the n-type region 20 of the semiconductor substrate 1, in which the first titanium nitride layer 53' having the first thickness remains in the n-type region 10 of the semiconductor substrate 1 to provide a work function adjusting titanium nitride layer for the functional gate structure of a planar p-type FET 100d. The exposed portions of the first titanium nitride layer 53' are removed using a selective etch. In some embodiments, instead of removing the first titanium nitride layer 53' in its entirety from the mid gap region 15 and the n-type region 20 of the substrate 1, the exposed portion of the first titanium nitride layer 53' may be etched to reduce its thickness to a second thickness that provides a mid gap work function for the mid gap FET 100e that is present in the mid gap region 15 of the semiconductor substrate 1. Additionally, in some embodiments, the portion of the first titanium nitride layer 53' may not be entirely removed from the n-type region 20 of the substrate 1, but recessed to a third thickness that produces an n-type work function for the planar n-type FET 100f, in which the third thickness is less than the aforementioned second thickness that produces a mid gap work function for the mid gap FET 100e. Further details for the etch process for reducing the thickness of the exposed portions of the first titanium nitride layer 53' or for removing the exposed portions of the first nitride layer 53' in their entirety have been provided in the above description of FIG. 6A.

It is noted that in the etch process steps described with reference to FIGS. 6A and 6B, the high-k dielectric layers 58, 61 in the mid gap region 15 and the n-type region 20 are protected by the metal containing buffer layer 52'. The high-k dielectric layers 58, 61 are never exposed during patterning of the first titanium nitride layer 53'. The present integration process is compatible with both oxide hard mask schemes and resist patterning schemes.

Figure 7A:
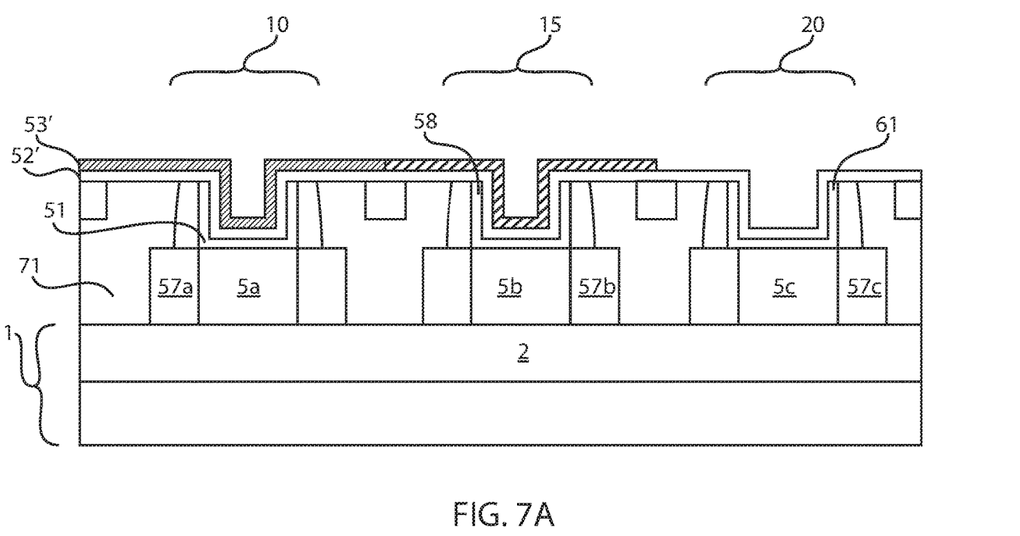
FIG. 7A is a side cross-sectional view depicting forming a second titanium nitride layer having a second thickness that is less than the thickness of the first titanium nitride layer on the channel region of the fin structure for the mid gap device, in accordance with one embodiment of the present disclosure.
Figure 7B:
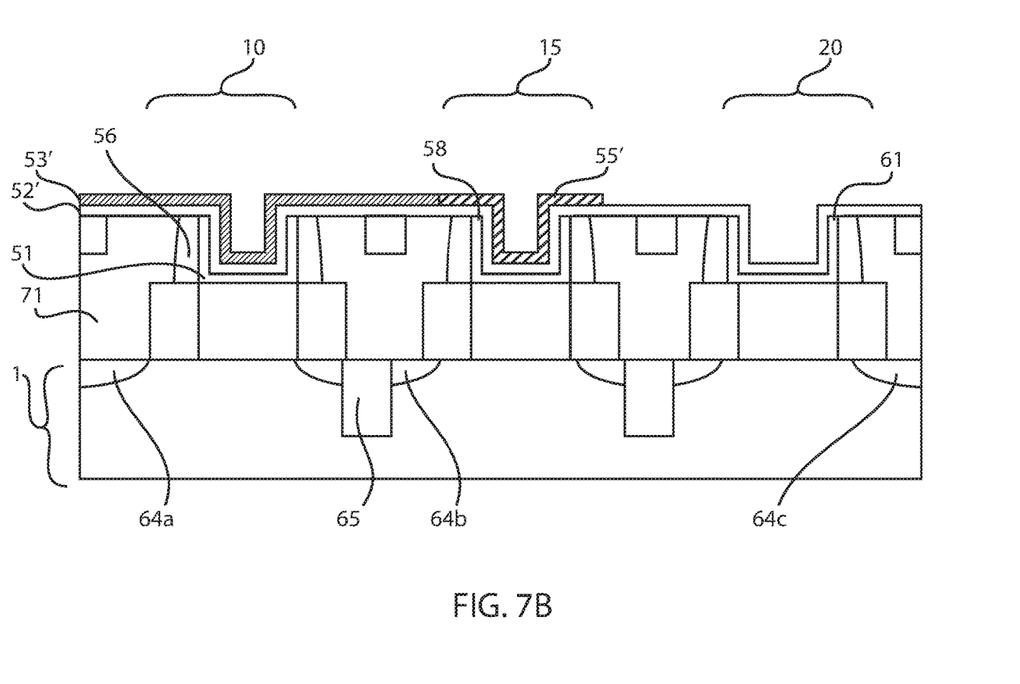
FIG. 7B is a side cross-sectional view depicting forming a second titanium nitride layer having a second thickness that is less than the thickness of the first titanium nitride layer on the channel region of the planar semiconductor device that is a mid gap device, in accordance with one embodiment of the present disclosure.

FIG. 7A depicts forming a second titanium nitride layer 55' having a second thickness that is less than the thickness of the first titanium nitride layer 53' on the channel region of the fin structure 5*b* for the mid gap FinFET 100*b*. FIG. 7B depicts forming a second titanium nitride layer 55' having a second thickness that is less than the thickness of the first titanium nitride layer 53' in the mid gap region 15 of the semiconductor substrate 1 on the channel region of the planar mid gap FET 100*e*.

In some embodiments, before forming the second titanium nitride layer 55', a second block mask (not shown), e.g., photoresist mask or hard mask, is formed over the n-type region 20 of the semiconductor substrate 1. In some embodiments, the block mask 72 that is present over the p-type region 10 of the semiconductor substrate 1 during etching of the exposed portions of the first titanium nitride layer 53' may remain over the n-type region 20 of the substrate 1 during formation of the second titanium nitride layer 55. If the block mask 72 that was present over the n-type region 20 has been removed, a new hard mask may be formed over the p-type region 10 prior to forming the second titanium nitride layer 55'. The combination of masks used are employed to cover p-type region 10 and n-type region 10 of the substrate 1 leaving the mid gap region 15 of the substrate 1 exposed. The second titanium nitride layer 55' may then be deposited on the exposed mid gap region 20 of the substrate. For example, the second titanium nitride layer 55' may be a blanket deposited conformal layer having at least a portion in direct contact with the metal containing buffer layer 52' in the gate opening within the mid gap region 15 of the substrate 1. The second titanium nitride layer 55' may also be formed using a physical vapor deposit (PVD) process, such as sputtering or plating. In other embodiments, the second titanium nitride layer 55' may also be deposited using chemical vapor deposition, such as plasma enhanced chemical vapor deposition (PECVD). The second titanium nitride layer 55' may be deposited to a second thickness that provides a mid gap work function for the mid gap FinFET 100*b* that is present in the mid gap region 15 of the semiconductor substrate 1, as depicted in FIG. 7A. The second titanium nitride layer 55' may be deposited to a second thickness that provides a mid gap work function for the mid gap FET 100*e* that is present in the mid gap region 15 of the semiconductor substrate 1, as depicted in FIG. 7B. The second thickness is less than the thickness of the first titanium nitride layer 53' that is present in the p-type region 10 of the semiconductor substrate 1.

In some embodiments, the n-type region 20 of the semiconductor substrate is entirely free of titanium nitride layers that can be incorporated into a functional gate structure. In some other embodiments, a third titanium nitride layer (not shown) may be deposited in the n-type region of the semiconductor substrate 5 having a thickness that is less than the thickness of the second titanium nitride layer 55 that is present in the mid gap region 15 of the semiconductor substrate 1. Block masks may be utilized to cover the first and second titanium nitride layers 53', 55' that are present in the p-type region 10 and the mid gap region 15 of the substrate 1, while the third titanium nitride layer is formed in the n-type region 20 of the substrate 1.

The block masks may then be removed using chemical stripping, selective etch or oxygen ashing.

In a following process step, the first gate conductor contact 54, the second gate conductor contact 60 and the third gate conductor contact 63 are formed in the p-type region 10, the mid gap region 15 and the n-type region 20. The first gate conductor contact 54, the second gate conductor contact 60 and the third gate conductor contact 63 may be deposited using a physical vapor deposition method. For example, the first gate conductor contact 54, the second gate conductor contact 60 and the third gate conductor contact 63 may be deposited using plating, electroplating, electroless plating, sputtering and combinations thereof. Examples of sputtering apparatus that may be suitable for depositing the first gate conductor contact 54, the second gate conductor contact 60 and the third gate conductor contact 63 include DC diode type systems, radio frequency (RF) sputtering, magnetron sputtering, and ionized metal plasma (IMP) sputtering. In addition to physical vapor deposition (PVD) techniques, the first gate conductor contact 54, the second gate conductor contact 60 and the third gate conductor contact 63 may also be formed using chemical vapor deposition (CVD).

In a following process step, the portions of the first gate conductor contact 54, the second gate conductor contact 60, the third gate conductor contact 63, the first titanium nitride layer 53', and the second titanium nitride layer 55' that are present on the upper surfaces of the interlevel dielectric 71 may be removed using a planarization process, such as chemical mechanical planarization (CMP), to provide the structures depicted in FIGS. 1A and 1B. Following planarization, the remaining portion of the first titanium nitride layer 53' provides the first titanium nitride layer 53 of the p-type FinFET 100*a*, as depicted in FIG. 1A, and the p-type FET 100*e*, as depicted in FIG. 1B. Following planarization, the remaining portion of the second titanium nitride layer 55' provides the second titanium nitride layer 55 of the mid gap FinFET 100*b*, as depicted in FIG. 1A, and the mid gap FET 100*f*, as depicted in FIG. 1B.

In accordance with some embodiments, the methods and structures of the present disclosure provide that the high-k dielectric layers are not exposed to etch chemistries following their formation. The n-type semiconductor devices may have superior leakage characteristics when compared to prior methods of formation for similar structures. Additionally, the work function metal patterning scheme is compatible with both photoresist masks and hard masks, e.g., silicon oxide masks.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a semiconductor device comprising:

forming a p-type semiconductor device in a p-type region of a substrate, the p-type semiconductor device having a p-type work function gate structure comprised of a titanium and nitrogen containing layer having a first thickness being selected to provide a work function close to the valence band of the substrate in the p-type region, the titanium and nitride layer having the first thickness being positioned between and in direct contact with a p-type contact fill and a tantalum nitride or tungsten nitride layer for a first diffusion barrier;

forming a mid gap semiconductor device in a mid gap region of the substrate having a mid gap gate structure comprised of a second titanium and nitrogen containing layer having a second thickness that is less than the first thickness present, wherein the second titanium and nitrogen containing layer is the work function adjusting layer for the mid gap semiconductor device, the second thickness for the second titanium containing layer to provide a work function between a valence band and the conduction band of the substrate in the mid gap region, the second titanium and nitride containing layer being positioned between and in direct contact with a mid gap contact fill and a tantalum nitride or tungsten nitride layer for a mid gap diffusion barrier; and forming an n-type semiconductor device in an n-type region of the substrate having an n-type work function gate structure comprised of an n-type gate conductor contact.

2. The method of claim 1, wherein the p-type semiconductor device further comprises a p-type gate conductor contact present on the titanium and nitrogen containing layer having the first thickness.

3. The method of claim 1, wherein the mid gap semiconductor device further comprises a mid gap gate conductor contact present on the second titanium and nitrogen containing layer.

4. The method claim 1, further comprising a third titanium containing layer having a third thickness that is less than the second thickness, and the third titanium containing layer present on the n-type gate conductor contact.

5. The method of claim 1, wherein forming the titanium and nitrogen containing layer having the first thickness comprises:
depositing a single titanium and nitrogen containing material layer having said first thickness for the first titanium containing layer over a channel region of the p-type semiconductor device, over a channel region of the mid gap semiconductor device and over a channel region of the n-type semiconductor device; and
removing the single titanium and nitrogen containing material layer having said first thickness from the mid gap region and the n-type region with an etch process.

6. The method of claim 5, wherein removing the single titanium containing material layer comprises forming a block mask over the titanium and nitrogen containing layer having the first thickness that is over the channel region of the p-type semiconductor device.

7. The method of claim 6, wherein forming the second titanium containing layer comprises:
forming block masks over the p-type region and the n-type region; and
forming the second titanium and nitrogen containing layer having the second thickness in the mid gap region of the substrate.

8. The method of claim 1, wherein the p-type semiconductor device is a p-type FinFET.

9. The method of claim 1, wherein the mid gap semiconductor device is a mid gap FinFET.

10. The method of claim 1, wherein the n-type semiconductor device is an n-type FinFET.

11. The method of claim 1, wherein the p-type semiconductor device is a planar p-type FET.

12. The method of claim 1, wherein the mid gap semiconductor device is a planar mid gap FET.

13. The method of claim 1, wherein the n-type semiconductor device is planar n-type FET.

14. A method of forming a semiconductor device comprising:
forming a second conductivity type semiconductor device in the second conductivity type region of a substrate having a second conductivity type work function gate structure comprising a first titanium and nitrogen containing layer having a thickness selected to provide a work function close to the valence band of the semiconductor substrate in the p-type device region, the titanium and nitride layer having the first thickness being positioned between and in direct contact with a second conductivity contact fill and a tantalum nitride or tungsten nitride layer for a first diffusion barrier;

forming a mid gap semiconductor device in the mid gap region of the semiconductor substrate having a mid gap gate structure comprising a second titanium and nitrogen containing layer having a second thickness selected to provide a work function between a valence band and the conduction band of the semiconductor substrate in the mid gap region, the second titanium and nitride containing layer being positioned between and in direct contact with a mid gap contact fill and a tantalum nitride or tungsten nitride layer for a mid gap diffusion barrier; and forming a first conductivity type semiconductor device in a first conductivity type region of the substrate having a first conductivity type work function gate structure comprised of a first conductivity type gate conductor contact.

15. The method of claim 14, wherein the titanium and nitrogen containing layer having the first thickness first titanium containing layer is titanium nitride.

16. The method of claim 14, wherein the mid gap semiconductor device further comprises a mid gap gate conductor contact present on the second titanium containing layer.

17. The method of claim 14, wherein the second conductivity type gate contact is a p-type gate conductor contact.

18. The method of claim 14, wherein the second conductivity type semiconductor device is a p-type FinFET, the mid gap semiconductor device is a mid gap FinFET.

19. The method of claim 14, wherein the first conductivity type semiconductor device is an n-type FinFET.

20. The method of claim 14, wherein the second conductivity type semiconductor device is a planar p-type FET, the mid gap semiconductor device is a planar mid gap FET, and the first conductivity type semiconductor device is planar n-type FET.

* * * * *